United States Patent
Baek et al.

(10) Patent No.: US 9,039,864 B2
(45) Date of Patent: May 26, 2015

(54) OFF-CENTER GROUND RETURN FOR RF-POWERED SHOWERHEAD

(75) Inventors: Jonghoon Baek, San Jose, CA (US); Beom Soo Park, San Jose, CA (US); Sam Hyungsam Kim, San Ramon, CA (US)

(73) Assignee: Applied Materials, Inc., Santa Clara, CA (US)

( * ) Notice: Subject to any disclaimer, the term of this patent is extended or adjusted under 35 U.S.C. 154(b) by 918 days.

(21) Appl. No.: 12/892,892

(22) Filed: Sep. 28, 2010

(65) Prior Publication Data
US 2011/0126405 A1 Jun. 2, 2011

Related U.S. Application Data

(60) Provisional application No. 61/246,535, filed on Sep. 29, 2009, provisional application No. 61/252,672, filed on Oct. 17, 2009.

(51) Int. Cl.
*H01J 37/32* (2006.01)

(52) U.S. Cl.
CPC ..... *H01J 37/32174* (2013.01); *H01J 37/32091* (2013.01); *H01J 37/32577* (2013.01)

(58) Field of Classification Search
CPC ............ H01J 37/32577; H01J 37/32183; H01J 37/32174; H01J 37/32091
USPC ............ 156/345.44, 345.43, 345.34, 345.47; 118/715, 723 E; 204/157.15; 315/111.21; 29/825

See application file for complete search history.

(56) References Cited

U.S. PATENT DOCUMENTS

| | | | |
|---|---|---|---|
| 5,252,178 A | 10/1993 | Moslehi |
| 5,272,417 A | 12/1993 | Ohmi |
| 5,573,595 A | 11/1996 | Dible |
| 5,733,511 A | 3/1998 | De Francesco |
| 5,882,411 A | 3/1999 | Zhao |
| 6,027,603 A | 2/2000 | Holland |

(Continued)

FOREIGN PATENT DOCUMENTS

| | | |
|---|---|---|
| DE | 4242894 A1 | 6/1994 |
| EP | 0961307 A2 | 12/1999 |

(Continued)

OTHER PUBLICATIONS

M.A. Lieberman et al., "Standing wave and skin effects in large-area, high-frequency capacitive discharges", Plasma Sources Sci. Technol., vol. 11, pp. 283-293, 2002, UK.

(Continued)

*Primary Examiner* — Jeffrie R Lund
*Assistant Examiner* — Yuechuan Yu
(74) *Attorney, Agent, or Firm* — Robert J. Stern

(57) ABSTRACT

An electrical ground (36) of an RF impedance matching network (33) is connected to a connection area (50) on the grounded chamber cover (18) of a plasma chamber. The connection area is offset away from the center of the chamber cover toward a workpiece passageway (20). Alternatively, an RF power supply (30) has an electrically grounded output (32) that is connected to a connection area (52) on the chamber cover having such offset. Alternatively, an RF transmission line (37) has an electrically grounded conductor (39) that is connected between a grounded output of an RF power supply and a connection area (52) on the chamber cover having such offset.

7 Claims, 4 Drawing Sheets

(56) References Cited

U.S. PATENT DOCUMENTS

| | | |
|---|---|---|
| 6,079,356 A | 6/2000 | Umotoy |
| 6,155,202 A | 12/2000 | Nakano |
| 6,228,229 B1 | 5/2001 | Raaijmakers |
| 6,254,738 B1 | 7/2001 | Stimson |
| 6,353,201 B1 | 3/2002 | Yamakoshi |
| 6,359,250 B1 | 3/2002 | Blonigan |
| 6,422,172 B1 | 7/2002 | Tanaka |
| 6,456,010 B2 | 9/2002 | Yamakoshi |
| 6,477,980 B1 | 11/2002 | White |
| 6,538,388 B2 | 3/2003 | Nakano |
| 6,552,297 B2 | 4/2003 | Blonigan |
| 6,620,290 B2 | 9/2003 | Yamamoto |
| 6,772,827 B2 | 8/2004 | Keller |
| 6,824,658 B2 | 11/2004 | Gopalraja |
| 6,827,815 B2 | 12/2004 | Hytros |
| 6,857,387 B1 | 2/2005 | Sun |
| 6,863,020 B2 | 3/2005 | Mitrovic |
| 6,884,635 B2 | 4/2005 | Parsons |
| 6,899,787 B2 | 5/2005 | Nakano |
| 6,916,401 B2 | 7/2005 | Long |
| 7,083,702 B2 | 8/2006 | Blonigan |
| 7,141,516 B2 | 11/2006 | Kawamura |
| 7,153,387 B1 | 12/2006 | Tomoyasu |
| 7,164,236 B2 | 1/2007 | Mitrovic |
| 7,205,034 B2 | 4/2007 | Kawamura |
| 7,270,713 B2 | 9/2007 | Blonigan |
| 7,988,815 B2 | 8/2011 | Rauf |
| 8,343,592 B2 | 1/2013 | Kudela |
| 2001/0021422 A1 | 9/2001 | Yamakoshi |
| 2002/0023899 A1 | 2/2002 | Khater |
| 2003/0037881 A1 | 2/2003 | Barnes |
| 2003/0079983 A1 | 5/2003 | Long et al. |
| 2003/0137249 A1* | 7/2003 | Nakano et al. ............ 315/111.21 |
| 2004/0194709 A1 | 10/2004 | Yamagishi |
| 2004/0261714 A1 | 12/2004 | Choi |
| 2005/0183827 A1 | 8/2005 | White |
| 2006/0021580 A1 | 2/2006 | Hirano |
| 2006/0027327 A1 | 2/2006 | Sorensen |
| 2006/0049138 A1 | 3/2006 | Miyake |
| 2006/0105114 A1 | 5/2006 | White |
| 2008/0274297 A1 | 11/2008 | Furuta |
| 2009/0101069 A1 | 4/2009 | Anwar |
| 2009/0159423 A1* | 6/2009 | Kudela et al. ............ 204/157.44 |
| 2009/0202741 A1 | 8/2009 | Stimson |
| 2010/0089319 A1 | 4/2010 | Sorensen |
| 2010/0206483 A1 | 8/2010 | Sorensen |

FOREIGN PATENT DOCUMENTS

| | | | |
|---|---|---|---|
| JP | 08-236294 A | | 9/1996 |
| JP | 2002-260899 A | | 9/2002 |
| KR | 2005009889 A | * | 1/2005 |
| KR | 2005017267 A | * | 2/2005 |
| KR | 2005058731 A | * | 6/2005 |

OTHER PUBLICATIONS

PCT International Preliminary Report on Patentability issued Apr. 3, 2012 for PCT application US2010050602.

* cited by examiner

OFF-CENTER GROUND RETURN FOR RF-POWERED SHOWERHEAD

CROSS-REFERENCE TO RELATED APPLICATIONS

This patent application claims the benefit of U.S. Provisional Application No. 61/246,535 filed Sep. 29, 2009 and U.S. Provisional Application No. 61/252,672 filed Oct. 17, 2009.

TECHNICAL FIELD

The invention relates generally to methods and apparatus for coupling an RF power source to a showerhead electrode of a plasma chamber used for fabricating electronic devices such as semiconductors, displays and solar cells. The invention relates more specifically to improving the uniformity of a plasma process performed in the plasma chamber by providing an electrical ground connection between an electrically grounded cover of the plasma chamber and either an RF impedance matching network or an RF transmission line.

BACKGROUND ART

Plasma chambers commonly are used to perform processes for fabricating electronic devices such as semiconductors, displays and solar cells. Such plasma fabrication processes include chemical vapor deposition of semiconductor, conductor or dielectric layers on the surface of a workpiece or etching of selected portions of such layers on the workpiece surface.

It is important for a plasma fabrication process to be performed with high spatial uniformity over the surface of the workpiece. That is, a deposition process should be performed so that the deposited material has uniform thickness and quality at all positions on the surface of the workpiece. Likewise, an etch process should etch material at a uniform rate at all such positions.

One cause of spatial non-uniformity in plasma fabrication processes is the workpiece passageway through which a workpiece can be transferred into or out of the plasma chamber. The workpiece passageway typically is on one side of the chamber wall, which creates an asymmetry in the plasma density above the workpiece. Specifically, in a plasma chamber having an RF powered showerhead, the plasma density is greater adjacent the end of the showerhead closest to the workpiece passageway than it is adjacent the opposite end of the showerhead. The asymmetry in plasma density is undesirable because it produces a corresponding asymmetry in the plasma process (e.g., deposition or etch) being performed on the workpiece.

One design that compensates for the asymmetry in plasma density that otherwise would be caused by the workpiece passageway is disclosed in U.S. patent application Ser. No. 12/343,519 filed Dec. 24, 2008 by Kudela et al., published on Jun. 25, 2009 as US patent application publication 2009-0159423 A1, owned by the same assignee as the present application, the entire disclosure of which is hereby incorporated by reference into the present application. That design supplies RF power to an electrode of the plasma chamber so that the supply of power is offset toward the direction of the workpiece passageway.

SUMMARY OF THE INVENTION

A first aspect or first embodiment of the present invention provides an electrical connection between an electrical ground of an RF impedance matching network and one or more connection areas on an electrically grounded chamber cover of a plasma chamber. According to the invention, the aforesaid connection areas include a first connection area on the chamber cover that is offset away from the center of the chamber cover toward a workpiece passageway in a side wall of the plasma chamber.

One advantage of the invention is that the offset toward the workpiece passageway of the first connection area on the chamber cover compensates for the asymmetry in plasma density that otherwise would be caused by the workpiece passageway, thereby enabling improved spatial uniformity of a plasma process performed in the chamber.

Another advantage of the aforesaid offset is that it reduces the inductance of the load impedance at the output of the impedance matching network, and thereby reduces the Q of the resonant circuit created by the impedance matching network in combination with the plasma chamber load. Reducing the Q has at least two important advantages. First, it reduces the peak voltage in the circuit, thereby reducing the risk of electrical arcing or component failure. Second, in the case of a fixed-reactance matching network that relies on a variable-frequency RF power supply to optimize the impedance match, a lower Q provides a wider range of load impedances that can be matched without exceeding a maximum acceptable standing wave ratio (SWR). This last advantage is especially important when process steps with different operating conditions are performed successively in the plasma chamber, because the different process steps typically present different loads to the matching network.

The invention can be used alone or in combination with the invention of the above-referenced US patent application of Kudela et al.

Optionally, the electrical ground of the RF impedance matching network also may be connected to the electrically grounded chamber cover at a second set of one or more additional connection areas that are not offset toward the workpiece passageway. Preferably, the connection areas in the first set collectively provide an RF connection path having a lower RF impedance than the connection areas in the second set. Preferably, the connection areas that are offset toward the workpiece passageway (the first set) collectively conduct more RF current than the connection areas that are not offset toward the workpiece passageway (the second set). Alternatively, the connection areas on the chamber cover are collectively characterized by a geometric centroid whose position is offset away from the center of the chamber cover toward the workpiece passageway.

In a second aspect or second embodiment of the invention, an RF power supply has a grounded output that is electrically connected to a connection area on the chamber cover that is offset away from the center of the chamber cover toward the workpiece passageway. Such offset of the ground connection of the RF power supply has advantages similar to the advantages of the first aspect or first embodiment of the invention in which the ground connection of the RF impedance matching network is offset as defined above.

In a third aspect or third embodiment of the invention, an RF transmission line has a grounded conductor that is electrically connected between an electrical ground of an RF power supply and a connection area on the chamber cover that is offset away from the center of the chamber cover toward the workpiece passageway. Such offset of the RF transmission line ground connection has advantages similar to the advantages of the first aspect or first embodiment of the invention in which the ground connection of the RF impedance matching network is offset as defined above.

In the second and third aspects of the invention, the grounded output of the RF power supply or the grounded conductor of the RF transmission line optionally may be connected to the electrically grounded chamber cover at additional connection areas that are not offset toward the workpiece passageway. Preferably, the connection areas in the first set collectively provide an RF connection path having a lower RF impedance than the connection areas in the second set. Preferably, the connection areas that are offset toward the workpiece passageway (the first set) collectively conduct more RF current than the connection areas that are not offset toward the workpiece passageway (the second set).

BEST MODE FOR CARRYING OUT THE INVENTION

1. Plasma Chamber Overview

Figure 1:
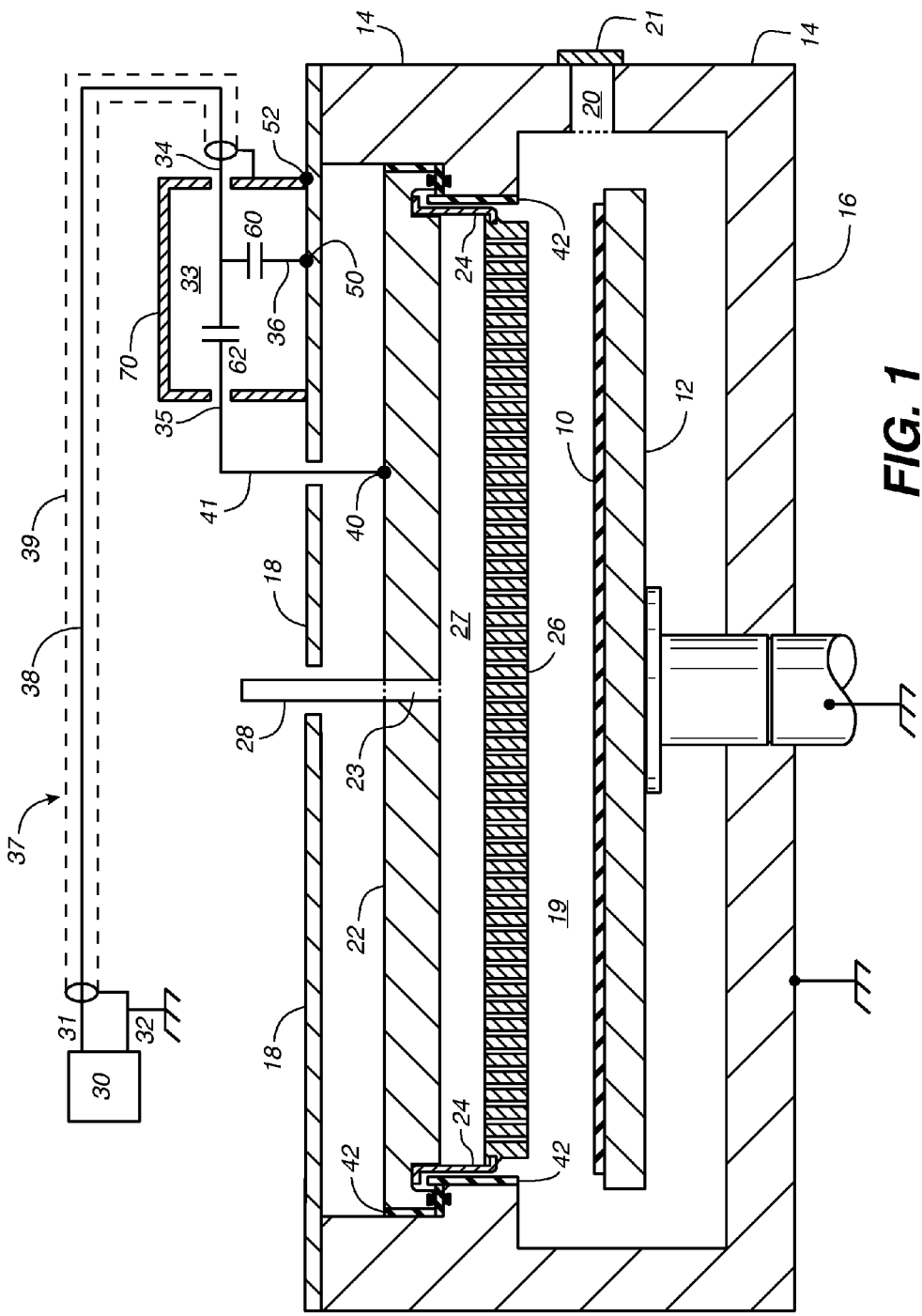
FIG. 1 is a sectional side view of a plasma chamber according to the invention, with an electrical schematic of the RF impedance matching network and RF power supply.
Figure 2:
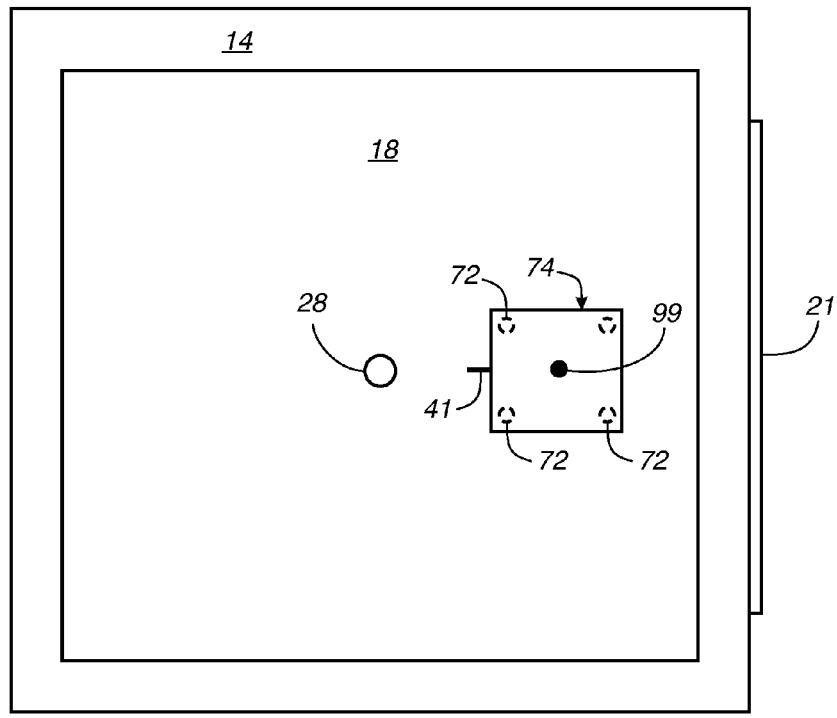
FIG. 2 is a top view of a plasma chamber like that of FIG. 1, but having different connections between the enclosure of the RF impedance matching network and the chamber cover.

FIGS. 1 and 2 show a plasma chamber that includes one embodiment of the invention. Before describing the invention, the conventional components of the plasma chamber will be described.

The plasma chamber is intended to subject a workpiece 10 to a plasma process step for fabricating on the workpiece electronic devices such as semiconductor devices, displays or solar cells. The workpiece is supported within the chamber by a workpiece support 12, also called a chuck or susceptor. Examples of a workpiece 10 that would be processed within the plasma chamber include a rectangular glass substrate on which flat panel displays or solar cells are fabricated or a circular semiconductor wafer on which integrated circuits are fabricated.

The plasma chamber has a chamber wall 14-18 that is electrically grounded and that surrounds the chamber interior 19. The chamber wall includes a chamber side wall 14, a chamber bottom wall 16, and a chamber cover 18. In the illustrated embodiment, the chamber side wall 14 and chamber bottom wall 16 are implemented as a unitary wall.

One side of the chamber side wall 14 includes a workpiece passageway 20 through which a workpiece can be carried into the chamber before processing and removed from the chamber after processing of the workpiece. A door 21, typically a gate valve (also referred to as a slit valve), is opened during ingress or egress of the workpiece and is closed to provide a vacuum seal within the plasma chamber during plasma processing of the workpiece.

In performing a plasma process on the workpiece 10, one or more process gases are dispensed into the plasma chamber through a gas inlet manifold 22-28 having an RF-powered back wall 22, one or more RF-powered side walls 24, and a showerhead 26, each of which is electrically conductive. Each RF-powered side wall is electrically connected between a perimeter portion of the RF-powered back wall and a perimeter portion of the showerhead. (We define "perimeter portion" of the back wall or showerhead to mean a portion thereof that includes a perimeter and a portion of the back wall or showerhead contiguous with said perimeter.)

The showerhead has a plurality of gas passageways, typically hundreds or thousands, extending between its upper and lower surfaces. An external gas source (not shown) supplies gas through at least one gas feed conduit 28 into the gas inlet manifold 22-28. In the FIG. 1 embodiment, the gas feed conduit 28 is a single pipe having an outlet connected to a gas passageway 23 in the center of the RF-powered back wall 22. The gas flows from the interior 27 of the gas inlet manifold through the gas passageways of the showerhead into the region of the plasma chamber between the showerhead and the workpiece.

An RF power supply 30 produces an RF voltage between its ungrounded (RF hot) output 31 and its electrically grounded output 32. The ungrounded output of the RF power supply is electrically connected to the input 34 of an RF impedance matching network 33. The output 35 of the RF impedance matching network is electrically connected, directly or indirectly, to the showerhead 26.

Unless the RF power supply 30 is mounted immediately adjacent the RF impedance matching network 33, the electrical connection between the RF power supply and the RF impedance matching network generally is an RF transmission line 37 having an ungrounded conductor 38 and a grounded conductor 39. The ungrounded conductor 38 electrically connects the ungrounded output 31 of the RF power supply to the input 34 of the RF impedance matching network. The grounded conductor 39 electrically connects the grounded output 32 of the RF power supply to an electrical ground 36 of the RF impedance matching network.

The grounded output 32 of the RF power supply, the grounded conductor 39 of the RF transmission line (if present), and the electrical ground 36 of the RF impedance matching network 33 are electrically connected, directly or indirectly, to the electrically grounded components of the plasma chamber. Such electrically grounded components include the chamber wall 14-18, as will be described in detail below. The electrically grounded components of the plasma chamber typically also include the workpiece support 12, which typically is connected to electrical ground through a plurality of ground straps connected between the workpiece support and the chamber side wall 14. Alternatively, the workpiece support commonly is connected to the electrically grounded chamber wall 14-18 through a capacitor whose capacitance is large enough to maintain the workpiece support at ground potential at the frequency of the RF power supply.

The RF voltage between the showerhead 26 and the electrically grounded components 12-18 of the plasma chamber capacitively couples RF power produced by the RF power supply to the interior 19 of the plasma chamber, thereby generating or sustaining a plasma within the plasma chamber.

Typically the output 35 of the RF impedance matching network 33 is not connected directly to the showerhead 26. Instead, the output 35 typically is electrically connected, by means of one or more electrical conductors 41 (referred to as RF feed conductors 41), to the RF-powered back wall 22 at one or more points referred to as RF drive points 40. RF current flows through the RF-powered back wall 22 from the one or more RF drive points 40 toward the perimeter portion of the RF-powered back wall, then through the RF-powered side walls 24 to the showerhead 26.

If the showerhead 26 is rectangular as in the illustrated embodiment, preferably the RF-powered back wall 22 also is rectangular, and preferably there are four RF-powered side walls 24 connected between a respective one of the four sides of the RF-powered back wall 22 and a corresponding one of the four sides of the showerhead 26.

The RF-powered side walls 24, in addition to conducting RF power as described in the preceding paragraph, also may function as a suspension that supports at least a portion of the weight of the showerhead 26 by suspending the showerhead from, and below, the RF-powered back wall 22. Each of the RF-powered side walls preferably is an aluminum sheet that is flexible so as to accommodate thermal expansion and contraction of the showerhead, as described in U.S. Pat. No. 6,477,980 issued Nov. 12, 2002 to White et al.

The electrical connections between the RF-powered side walls 24 and the RF-powered back wall 22 and the showerhead 26 can be mechanically fixed or moveable. A mechanically moveable connection may be beneficial to accommodate radial expansion and contraction of the showerhead as the temperature of the showerhead rises and falls. For example, FIG. 1 shows a sliding connection implemented by resting the rim of the showerhead on a lower flange of the RF-powered back wall that extends radially inward, as described in U.S. Pat. No. 7,484,473 issued Feb. 3, 2009 to Keller et al.

Dielectric liners 42 electrically and mechanically separate the RF-powered back wall 22 and the RF-powered side walls 24 from the electrically grounded components such as the chamber side wall 14, the chamber cover 18, and the gas feed conduit 28. Optionally, additional dielectric liners (not shown) may surround the gas feed conduit 28 and the RF feed conductor 41 where they pass through the chamber cover.

Although the present invention primarily relates to the capacitively coupling RF power to a plasma from an RF-powered showerhead, additional RF power may be coupled to the plasma by other means such as an induction coil or a microwave waveguide. Also, plasma generated in a remote plasma source may be flowed into the interior 19 of the plasma chamber by means of the aforesaid gas feed conduit 28 or a separate remote plasma feed conduit (not shown).

2. Basic Principles of the Invention

As stated in the "Background of the Invention", the workpiece passageway 20 produces an asymmetry in the plasma density in the region between the showerhead 26 and the workpiece 10, and thereby produces an asymmetry in the film being formed or patterned by the plasma process performed in the plasma chamber. Specifically, if the one or more RF drive points 40 are either centered or distributed symmetrically relative to the center of the RF-powered back wall 22, the plasma density generally will be greater adjacent the end of the showerhead closest to the workpiece passageway 20 than it is adjacent the opposite end of the showerhead.

The present invention, according to a first aspect or first embodiment, compensates for the asymmetry caused by the workpiece passageway 20 by providing an offset ground connection between the RF impedance matching network 33 and the chamber cover 18. Advantageously, this enables an improvement in the spatial uniformity of a plasma process performed in the chamber.

Specifically, the first aspect or first embodiment of the invention provides an electrical connection between an electrical ground 36 of the RF impedance matching network 33 and at least a first connection area 50 on the electrically grounded chamber cover 18 of the plasma chamber. The first connection area on the chamber cover is offset away from the center of the chamber cover toward the workpiece passageway 20.

We use the term "electrical ground 36 of the RF impedance matching network" to mean any portion of the RF impedance matching network 33 that is connected to electrical ground. In the embodiment shown in FIG. 1, the electrical ground 36 is one terminal of the shunt reactance 62, and the shunt reactance is a capacitor. However, other RF impedance matching network topologies are well known and may include one or more inductors.

Figure 3:
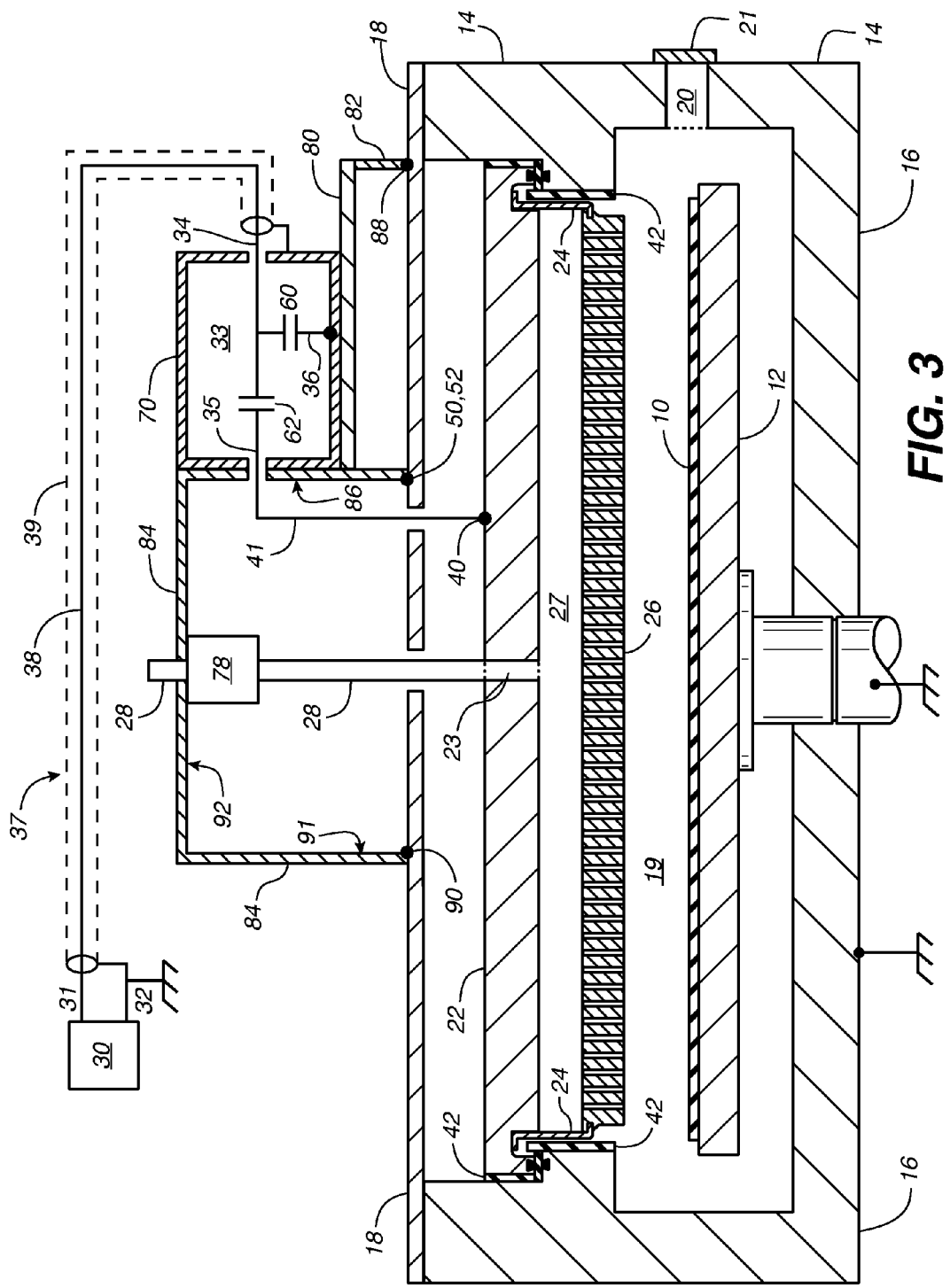
FIG. 3 is a sectional side view of a plasma chamber like that of FIG. 1, but with the RF impedance matching network mounted on a platform.
Figure 5:
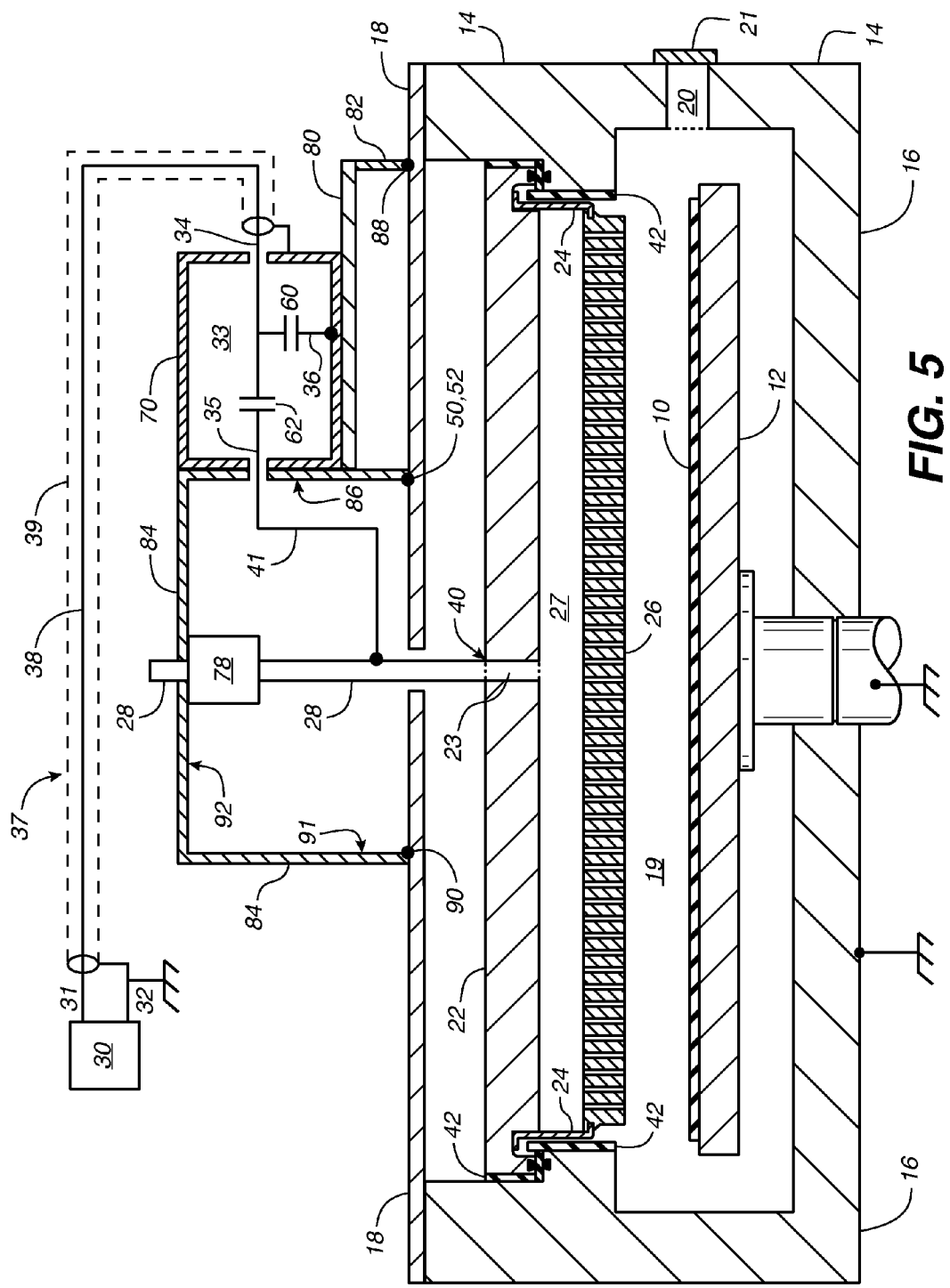
FIG. 5 is a sectional side view of a plasma chamber like that of FIG. 3, but with the output of the RF impedance matching network connected to the gas feed conduit.

As described in the "Background of the Invention", the input 34 of the RF impedance matching network 33 commonly is connected to an RF power supply 30 by means of an RF transmission line 37. According to another aspect or embodiment of the invention, a grounded conductor 39 of the RF transmission line is electrically connected to at least a second connection area 52 on the chamber cover, wherein the second connection area on the chamber cover is offset away from the center of the chamber cover toward the workpiece passageway. Such offset of the connection area 52 of the RF transmission line ground augments the advantages of the offset of the connection area 50 of the RF impedance matching network ground, as defined in the three preceding paragraphs. The first and second ground connection areas 50, 52 on the chamber cover need not be distinct as shown in FIG. 1; they may be identical or coincident as shown in FIGS. 3 and 5.

While the invention is not limited to any theory of operation, we believe the theoretical basis of the invention is as follows. When the RF-powered showerhead 26 couples RF power to plasma within the plasma chamber, RF current flows from the ungrounded output 31 of the RF power supply 30, through the RF impedance matching network 33, and through the showerhead to the plasma. The RF current returns to the grounded output 32 of the RF power supply through the grounded components of the plasma chamber. The RF current flow to the grounded output 32 of the RF power supply is referred to herein as the "return RF current", and any path through with a portion of the return RF current flows is referred to herein as an "RF ground return path".

A portion or all of the return RF current flows through the first connection area 50 at which the chamber cover 18 connects to an electrical ground 36 of the RF impedance matching network 33. In embodiments that include a distinct second connection area 52 as defined above, another portion of the return RF current flows through the second connection area 52 at which the chamber cover 18 connects to the ground conductor of the RF transmission line 37.

We believe that positioning the first connection area 50 or the second connection area 52 on the electrically grounded chamber cover so as to be offset toward the workpiece passageway 20 reduces the impedance of the RF ground return path to the RF power supply 30 from the portion of the chamber side wall 14 at the side of the plasma chamber closest to the workpiece passageway in comparison with the impedance of the RF ground return path from the portion of the chamber side wall 14 at the opposite side of the plasma chamber. We believe this lower impedance ground return path reduces the gradient of the RF electric field in the region of the plasma chamber close to the workpiece passageway, and thereby reduces the plasma density close to the workpiece passageway.

Preferably, the respective positions of the first and second connection areas 50, 52 on the electrically grounded chamber cover—in particular, the respective distances by which such connection areas are offset away from the center of the chamber cover 18 toward the workpiece passageway 20—are established so as to minimize either the spatial non-uniformity of the plasma density or the spatial non-uniformity of the plasma process being performed on the workpiece.

Alternatively, the connection areas on the chamber cover are collectively characterized by a geometric centroid 99 whose position is offset away from the center of the chamber cover toward the workpiece passageway.

The invention can be used alone or in combination with offsetting the one or more RF drive points 40 in accordance with the invention of the US patent application of Kudela referenced above in the "Background of the Invention".

The workpiece support 12, showerhead 26 and chamber cover 18 in the illustrated embodiments are rectangular because the illustrated plasma chamber is adapted for processing a rectangular workpiece 10. However, as explained at the beginning of the preceding section "1. Plasma Chamber Overview", the invention is equally applicable to a plasma chamber, adapted for processing a circular workpiece, in which each of these components is circular.

3. Details of Matching Network and Ground Connection

A conventional RF impedance matching network 33 generally includes at least one shunt reactance 60 and at least one series reactance 62. One or more series reactances are connected in series between the input 34 and output 35 of the matching network. Each shunt reactance 60 is connected between an electrical ground 36 of the matching network and another element of the matching network, such as the input 34, the output 35, or one of the series reactances. Each reactance 60, 62 can be a capacitor or an inductor. Also a series or shunt reactance can include a plurality of reactances in series or parallel, such as a capacitor and inductor in series or in parallel.

FIG. 1 illustrates an RF impedance matching network 33 having a series reactance 62 that is a capacitor connected between the input 34 and the output 35 of the matching network. The illustrated shunt reactance 60 is a capacitor connected between electrical ground and the input 34 of the matching network.

In the context of the invention, we define an electrical ground 36 of the RF impedance matching network 33 as any portion of the RF impedance matching network that is connected to electrical ground. We define a first connection area 50 on the electrically grounded chamber cover 18 as an area on the chamber cover to which an electrical ground 36 of the RF impedance matching network is electrically connected.

A first aspect or first embodiment of the invention is characterized by the first connection area 50, as defined in the previous paragraph, being offset away from the center of the chamber cover 18 toward the workpiece passageway 20. Alternative embodiments with multiple or spatially distributed ground connection areas are described below.

To illustrate these definitions, FIG. 1 shows a ground conductor 36 connecting the shunt reactance 60 to the first connection area 50 on the chamber cover 18. Alternatively, one terminal of the shunt reactance can be mounted directly on the chamber cover without any intermediate conductor, in which case said one terminal of the shunt reactance would be a ground conductor 36.

The center of the chamber cover 18 is depicted in FIGS. 1 and 2 as where the gas feed conduit 28 extends through the chamber cover. In the illustrated embodiment, the outlet of the gas feed conduit is connected to a gas passageway 23 in the center of the RF-powered back wall 22, and the gas feed conduit extends straight upward from the RF-powered back wall through the center of the chamber cover 18 (as explained in the preceding section "1. Plasma Chamber Overview").

More generally, the invention is defined relative to the center of the chamber cover regardless of where the gas feed conduit is connected. For example, as in some conventional plasma chambers, multiple gas feed conduits can be connected to spatially distributed areas on the RF-powered back wall, and these gas feed conduits need not extend through the center of the chamber cover.

FIGS. 1 and 2 show that the RF impedance matching network 33 typically is enclosed on its top and sides by an electrically conductive enclosure 70 that is electrically and mechanically connected to the electrically grounded chamber cover 18.

In an alternative embodiment (not shown), instead of the shunt reactance 60 being connected directly to the chamber cover as in FIG. 1, the shunt reactance can be connected to the enclosure 70, which in turn is connected to the chamber cover. In that case, the electrical ground 36 of the RF impedance matching network would include the enclosure.

If the electrical ground 36 of the RF impedance matching network includes the enclosure 70 as described in the preceding paragraph, the connection areas on the chamber cover that are electrically connected to the ground 36 of the RF impedance matching network include all areas on the chamber cover that electrically contact the enclosure 70. Any one of these connection areas that is offset away from the center of the chamber cover toward the workpiece passageway 20 can be considered to be the first connection area 50.

4. Second Ground Connection to RF Power Supply

An electrical connection between the grounded conductor 39 of the RF transmission line 37 and one of the electrically grounded components of the plasma chamber can provide an RF ground return path to the RF power supply 30. A second aspect or second embodiment of the invention is to connect the grounded conductor 39 of the RF transmission line to a second connection area 52 on the chamber cover 18, wherein the second connection area is offset away from the center of the chamber cover toward the workpiece passageway.

Alternatively, if the output 31 of the RF power supply is connected directly to the input 34 of the impedance matching network without an intervening RF transmission line 37 (as would be possible if the RF power supply 30 is located adjacent the RF impedance matching network 33), then the second aspect or second embodiment of the invention can be defined as the RF power supply having a grounded output 32 that is electrically connected to a second connection area 52 on the chamber cover that is offset away from the center of the chamber cover toward the workpiece passageway.

Such offset of the second ground connection 52 on the chamber cover 18 (whether connected to the RF transmission line 37 or to the RF power supply 30) has advantages similar to the advantages of the first aspect or first embodiment of the invention in which the ground connection of the RF impedance matching network is offset as defined above.

The most direct means for connecting the grounded conductor 29 of the RF transmission line to the chamber cover 18 typically is the enclosure 70 of the RF impedance matching network 33. As shown in FIG. 1, the grounded conductor of the RF transmission line can be connected to the enclosure 70 adjacent the location where the ungrounded conductor 38 of the RF transmission line enters the enclosure 70.

The enclosure 70 of the RF impedance matching network can be electrically connected to the chamber cover 18 through any conventional means. FIG. 2 shows that the enclosure 70 of the RF impedance matching network 33 can be electrically and mechanically connected to the electrically grounded chamber cover 18 by means of a plurality of bolts 72. In such case, the second connection area 52 on the chamber cover can include one or more of the areas on the chamber cover that electrically contacts the bolts 72. In addition to, or instead of, the bolts 72, a reliable RF connection may be achieved by welding or soldering the perimeter 74 of the bottom of enclosure 70 to the chamber cover, in which case the second connection area 52 on the chamber cover can include one or more of the areas on the chamber cover that electrically contacts the welded or soldered perimeter 74.

If an electrical ground 36 of the RF impedance matching network 33 also is connected to the enclosure 70, then the connection of the enclosure 70 to the chamber cover can function both as the first connection area 50 (to the ground 36 of the RF impedance matching network 33) and as second connection area 52 (to the grounded conductor 32 of the RF transmission line).

The offset of the first connection area 50 and the offset of the second connection area 52 toward the workpiece passageway 20 both separately contribute to an increase in the plasma density toward the workpiece passageway. In other words, the effects of both offsets are approximately additive.

On the other hand, the offset of the first connection area 50 toward the workpiece passageway 20 and the offset of the second connection area 52 toward the workpiece passageway are distinct inventions than can be used independently, without the use of the other. For example, the invention of the offset of the second connection area 52 toward the workpiece passageway is useful to reduce the plasma density toward the workpiece passageway, and thereby improve overall spatial uniformity of the plasma, regardless of whether the plasma chamber includes a first connection area 50 that is offset toward the workpiece passageway. Likewise, the invention of the offset of the first connection area 50 toward the workpiece passageway is useful to reduce the plasma density toward the workpiece passageway, and thereby improve overall spatial uniformity of the plasma, regardless of whether the plasma chamber includes a second connection area 52 that is offset toward the workpiece passageway.

Preferably, the respective positions of the first and second connection areas 50, 52—i.e., the respective distances by which such connection areas are offset away from the center of the chamber cover 18 toward the workpiece passageway 20—are established so as to minimize either the spatial non-uniformity of the plasma density or the spatial non-uniformity of the plasma process being performed on the workpiece. Positions that minimize such non-uniformity can be determined empirically by measuring the spatial distribution of a characteristic of a layer being processed on the workpiece and comparing such measurements for different positions of the first connection area, the second connection area, or both.

5. Indirect Connection to Chamber Cover: Matching Network on Platform

Figure 4:
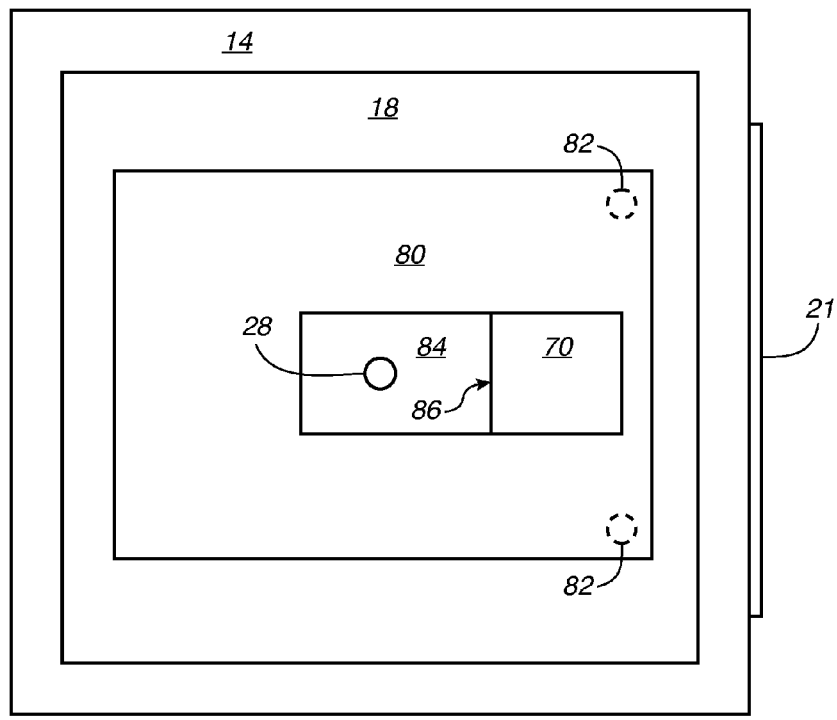
FIG. 4 is a top view of the plasma chamber of FIG. 3.

FIGS. 3 and 4 show an alternative embodiment in which the RF impedance matching network 33 is not mounted directly on the electrically grounded chamber cover 18. In this embodiment, the RF impedance matching network is mounted on a platform 80, and the platform is mounted to the chamber cover by bolts extending through posts 82 that maintain a spacing between the platform and the chamber cover. The air gap between the platform and the chamber cover, and the relatively small contact area between the posts and the chamber cover, thermally isolate the platform from the hot chamber cover so as to provide a cool surface for personnel to walk on. The posts are electrically conductive and are connected to the chamber cover at connection areas 88, but the posts are not intended to conduct RF current between the chamber cover 18 and the platform 80, as explained below.

The embodiment of FIGS. 3 and 4 also includes an electrically grounded gas feed enclosure 84 that surrounds a portion of the gas feed conduit 28 that protrudes through and above the chamber cover 18. The gas feed enclosure is electrically grounded because it is mechanically and electrically connected to the chamber cover 18, which is electrically grounded as described above in the section "1. Plasma Chamber Overview".

The gas feed conduit 28 electrically contacts the top wall of the electrically grounded gas feed enclosure 84. The gas feed conduit 28 passes through an RF choke 78 that blocks RF power from the showerhead 26 from being conducted through the gas feed conduit to the top wall of the gas feed enclosure.

The shunt reactance 60 within the RF impedance matching network 33 and the grounded conductor 39 of the RF transmission line 37 are electrically grounded by being connected to the enclosure 70 of the RF impedance matching network. The enclosure 70 is mechanically and electrically connected to the gas feed enclosure 84, which is mechanically and electrically connected to the electrically grounded chamber cover 18.

The first aspect or first embodiment of the invention was defined in the above section "2. Basic Principles of the Invention" as having an electrical ground 36 of the RF impedance matching network 33 that is connected to at least a first connection area 50 on the chamber cover 18. The above definition of the first aspect or first embodiment of the invention further requires that the first connection area 50 is offset away from the center of the chamber cover toward the workpiece passageway 20.

Applying this definition of the invention to the embodiment of FIGS. 3 and 4 as described in the immediately preceding paragraph, the first connection area 50 on the chamber cover is the area of contact between the chamber cover 18 and the side 86 of the gas feed enclosure 84 that abuts the enclosure 70 of the RF impedance matching network 33. As also required by this definition of the invention, the first connection area 50 in this embodiment is offset away from the center of the chamber cover toward the workpiece passageway 20. (In the illustrated embodiment, the center of the chamber cover is where the gas feed conduit 28 protrudes through the chamber cover.)

6. Second Set of Connection Areas Not Offset Toward Workpiece Passageway

Optionally, the electrical ground 36 of the RF impedance matching network 33 may be additionally connected to the electrically grounded chamber cover 18 at a second set of one or more connection areas 90 that are not offset toward the workpiece passageway. Preferably, the connection areas 90 of the second set are configured so that they collectively conduct a smaller RF current than the first set of one or more connection areas 50 that are offset toward the workpiece passageway.

This may be expressed in terms of RF impedance rather than current flow as follows. The connection areas on the chamber cover at which the electrical ground 36 of the RF impedance matching network is electrically connected to the chamber cover 18 includes a first set of one or more connection areas 50 that are offset away from the center of the chamber cover toward the workpiece passageway and, optionally, a second set of one or more connection areas 90 that are not offset away from the center of the chamber cover toward the workpiece passageway. The connection areas 50 in the first set collectively provide a first RF connection path (i.e., a first RF ground return path) between the chamber cover and the electrical ground of the RF impedance matching network. The connection areas 90 in the second set respectively provide a second RF connection path (i.e., a second RF ground return path) between the chamber cover and the electrical ground of the RF impedance matching network. The first RF connection path has a lower RF impedance than the second RF connection path.

For example, in the embodiment of FIGS. 3 and 4, the majority of RF current from the grounded chamber cover 18 to the electrical ground 36 of the RF impedance matching network flows through the first connection area 50 that comprises the area of contact between the chamber cover and the gas feed enclosure's wall 86 that abuts the enclosure 70 of the matching network. However, there is an additional electrical connection area 90 through the area of contact between the opposite (left) wall of the gas feed enclosure 84 and the chamber cover 18. The additional electrical connection area 90 is on the opposite side of the center of the chamber cover 18, hence it is not offset from the center of the chamber cover toward the workpiece passageway 20.

Although a small amount of RF current may be conducted through the additional connection area 90, the previously described advantages of the invention are achieved because a much greater proportion of RF current is conducted through the first connection area 50. In other words, the RF connection path (i.e., the RF ground return path) through the first connection area 50 has a much lower RF impedance than the RF connection path through the second connection area 90. The reason for this difference in RF current and RF impedance is as follows:

The RF drive point 40 and the RF feed conductor 41 are much closer to the right wall 86 than to the left wall 91 or the top wall 92 of the gas feed enclosure. Therefore, the inductance between the RF feed conductor 41 and the lower portion of the right wall 86 extending from the first connection area 50 to the electrically grounded enclosure 70 of the matching network is much lower than the inductance between the RF feed conductor 41 and the RF current path that extends from the "additional" electrical connection area 90, through the left wall 91, then through the top wall 92 to the electrically grounded enclosure 70 of the matching network.

Because of this difference in inductance, the RF impedance of the RF current path (i.e., the RF ground return path) through the first connection area 50 is much lower than the RF impedance of the RF current path through the additional connection area 90. Consequently, with respect to the RF current flow from the electrically grounded chamber wall 18 to the electrical ground 36 of the RF impedance matching network 33 (i.e., the return RF current) in response to the RF power produced by the RF power supply, a much greater proportion of such RF current flow is conducted through the first connection area 50 than through the additional connection area 90.

In other words, the RF impedance of the RF current path from the first connection area 50 on the chamber cover to the electrical ground 36 of the RF impedance matching network is much lower than the RF impedance of the RF current path from the additional connection area 90 on the chamber cover to the electrical ground 36 of the matching network.

The advantages of the invention are achieved because the former, lower impedance path includes said first connection area 50 on the chamber cover that is offset away from the center of the chamber cover toward the workpiece passageway 22. The additional connection area 90 on the chamber cover does not defeat the advantages of the invention because it is within a higher impedance path between the chamber cover and the electrical ground 36 of the RF impedance matching network.

A simpler alternative definition of the invention described in this Section 6 "Second Set of Connection Areas Not Offset Toward Workpiece Passageway" is that the distance between the RF feed 40 on the RF-powered back wall 22 and each of the first set of connection areas 50 on the chamber cover that are offset away from the center of the chamber cover toward the workpiece passageway is less than each respective distance between the RF feed 40 on the RF-powered back wall 22 and each respective one of the second set of connection areas 90 on the chamber cover that are not offset away from the center of the chamber cover toward the workpiece passageway. This geometry generally achieves the desired result of the RF ground return path through the first set of connection areas having a lower RF impedance than the RF ground return path through the second set of connection areas, as described above.

The first and second sets of connection areas have been described in this Section 6 with respect to the connections to the electrical ground 36 of the RF impedance matching network. The same principle applies to the connections on the chamber cover 18 to the grounded conductor 39 of the RF transmission line or to the connections to the grounded output 32 of the RF power supply. Specifically, the entire discussion in this Section 6 "Second Set of Connection Areas Not Offset Toward Workpiece Passageway" remains true if every reference in the discussion to a connection to the electrical ground 36 of the RF impedance matching network is replaced by a reference to a connection to the grounded conductor 39 of the RF transmission line or to the grounded output 32 of the RF power supply. Therefore, an alternative invention is defined by substituting a connection to the grounded conductor 39 of the RF transmission line or to the grounded output 32 of the RF power supply in place of every reference in the preceding discussion to a connection to the electrical ground 36 of the RF impedance matching network.

7. Avoiding Parasitic Plasma in Gas Feed Conduit

Aside from the plasma non-uniformity caused by the workpiece passageway, another shortcoming of prior art designs is a susceptibility to the formation of parasitic plasma in the gas feed conduit. Specifically, in prior art designs the RF power supplied to the RF-powered back wall commonly produces an RF voltage across the outlets of the gas feed conduits that that can be great enough to ignite a parasitic (i.e., unintended) plasma within the gas feed conduit.

We have discovered that such parasitic plasma in the gas feed conduit can be avoided by connecting the outlet of the gas feed conduit 28 to a gas passageway 23 in center of the RF-powered back wall 22, in combination with locating the RF drive point 40 at a location on the RF-powered back wall that is offset away from the gas passageway 23 toward the workpiece passageway 20 as shown in FIG. 3. We have found that this design reduces the RF voltage across the outlet of the gas feed conduit 28, thereby overcoming the risk of parasitic plasma in the gas feed conduit.

Preferably, such RF voltage is further reduced by connecting the ground 36 of the RF impedance matching network 33 to a connection area 50 on the chamber cover that is offset away from the center of the chamber cover toward the workpiece passageway 20 as shown in FIG. 3.

There is a further advantage to positioning both the RF drive point 40 and the first connection area 50 at which the ground 36 of the RF impedance matching network connects to the chamber cover so that both are offset toward the workpiece passageway as described in the two preceding paragraphs. As described in the preceding section "6. Second Set of Connection Areas Not Offset Toward Workpiece Passageway", the RF ground return path through the first connection area 50 has a lower RF impedance and conducts more RF current than the RF ground return path through the second set of one or more connection areas 90 that are offset in the opposite direction from the workpiece passageway.

Preferably, the aforesaid gas passageway 23 in the center of the RF-powered back wall 22 is the only gas passageway in the RF-powered back wall. Such central location is advantageous to maximize spatial uniformity and symmetry of the plasma in the chamber.

Preferably the aforesaid RF drive point 40 is the only location on the RF-powered back wall 22 that is connected to receive RF power from an RF power supply 30. Employing only a single RF drive point is advantageous to minimize any change in the spatial uniformity of the plasma in response to changes in process conditions that can change the load impedance presented by the plasma to the RF impedance matching network 33.

8. Proximity Effect

In RF circuits in which multiple electrical connections provide multiple possible current paths between two points, one scientific phenomenon that can determine which of the electrical connections conduct RF current is the "proximity effect". The proximity effect characterizes AC current through a pair of conductors that are close enough to be affected by each other's electromagnetic fields. If the two conductors carry currents in opposite directions—as in the present case in which the RF-powered back wall 22 and the electrically grounded chamber cover 18 are respectively connected to the ungrounded and grounded outputs 31, 32 of the RF power supply 30—current through one conductor is concentrated near a surface of that conductor that faces the other conductor, i.e., the conductor of return current.

In the embodiment of FIGS. 3 and 4, the proximity effect explains why essentially no RF ground return current flows from the chamber side wall 14 through the platform support posts 82 through the platform 80 to either the electrical ground 36 of the RF impedance matching network or to the grounded conductor 39 of the RF transmission line. The chamber cover 18 electrically shields the platform 80 and posts 82 from the electromagnetic field produced by RF current in the RF-powered back wall 22. Therefore, essentially all the RF ground return current from the chamber side wall 14 to the electrical ground 36 of the matching network flows through the lower surface of the chamber cover 18 that faces the RF-powered back wall 22.

We define an "RF current connection" to mean an electrical connection that is configured so as to conduct RF current between the electrical ground 36 of the RF impedance matching network and the chamber cover 18. The first connection location 50 is an "RF current connection" because it conducts RF current as just described. In other words, the connection between the electrical ground 36 of the RF impedance matching network and the first connection location 50 on the chamber cover is configured as an RF current connection, i.e., configured so as to conduct RF current between the electrical ground of the RF impedance matching network and the chamber cover. Conversely, the respective locations 88 where the respective posts 82 connect to the chamber cover 18 (see FIGS. 3 and 4) are not RF current connections because no RF current flows through the locations 88, as explained above.

9. RF Drive Points in Alternative Embodiments

Although the invention is defined by a ground connection that is offset away from the center of the grounded chamber cover toward the workpiece passageway 20, the invention does is not limited by the location of the one or more RF drive points 40. In the previously discussed embodiments of FIGS. 1-4, the RF drive point 40 is offset toward the workpiece passageway.

FIG. 5 illustrates an alternative embodiment of the invention in which the RF feed conductor 41 is electrically connected to the gas conduit 28 whose lower portion is electrically connected to the center of the RF-powered back wall 22 of the plasma chamber. Therefore, the RF drive point 40 is at the center of the back wall 22 in the FIG. 5 embodiment.

Although the invention encompasses multiple RF drive points 40 as described above, preferably the RF-powered back wall 22 has only a single RF drive point 40 connected to receive RF power from an RF power supply 30. Employing only a single RF drive point is advantageous to minimize any change in the spatial uniformity of the plasma in response to changes in process conditions that can change the load impedance presented by the plasma to the RF impedance matching network 33.

The invention claimed is:

1. Apparatus for coupling RF power to a plasma chamber, comprising:
   an electrically grounded chamber wall that surrounds a plasma chamber interior, wherein the electrically grounded chamber wall includes a chamber cover and a chamber side wall;
   a workpiece passageway in the chamber side wall;
   a showerhead that is electrically conductive and includes a plurality of gas passageways; and
   an RF impedance matching network comprising: (i) an input adapted to receive RF power, (ii) an output electrically connected to the showerhead, and (iii) an electrical ground that is electrically connected to a plurality of distinct, non-contiguous connection areas on the chamber cover;
   wherein said connection areas on the chamber cover collectively are characterized by a geometric centroid having a position that is offset away from the center of the chamber cover toward the workpiece passageway; and
   wherein said connection areas on the chamber cover collectively constitute the entire area on the chamber cover that is electrically connected to the electrical ground of the RF impedance matching circuit.

2. A method for coupling RF power to a plasma chamber, comprising the steps of:
   providing an electrically grounded chamber wall that surrounds a plasma chamber interior, wherein the electrically grounded chamber wall includes a chamber cover and a chamber side wall;
   providing a workpiece passageway in the chamber side wall;
   providing within the plasma chamber a showerhead that is electrically conductive and includes a plurality of gas passageways; and
   providing an RF impedance matching network comprising: (i) an input adapted to receive RF power, (ii) an output electrically connected to the showerhead, and (iii) an electrical ground that is electrically connected to a plurality of distinct, non-contiguous connection areas on the chamber cover;

wherein said connection areas on the chamber cover collectively are characterized by a geometric centroid having a position that is offset away from the center of the chamber cover toward the workpiece passageway; and wherein said connection areas on the chamber cover collectively constitute the entire area on the chamber cover that is electrically connected to the electrical ground of the RF impedance matching circuit.

3. The method of claim 2, further comprising the steps of:
providing a gas feed conduit in fluid communication with the showerhead, wherein the gas feed conduit extends through the chamber cover;
electrically connecting an electrically conductive shield to the chamber cover, wherein the shield encircles a portion of the gas feed conduit; and
electrically connecting the electrical ground of the RF impedance matching network to the shield such that the shield provides an electrical connection between the electrical ground of the RF impedance matching network and said first connection area on the chamber cover.

4. The method of claim 2, further comprising the steps of:
providing an RF power supply having an ungrounded output and a grounded output;
electrically connecting the ungrounded output of the RF power supply to said input of the RF impedance matching network; and
electrically connecting the grounded output of the RF power supply to a second connection area on the chamber cover;
wherein the second connection area on the chamber cover is offset away from the center of the chamber cover toward the workpiece passageway.

5. The method of claim 4, further comprising the steps of:
providing an RF transmission line having an ungrounded conductor and a grounded conductor;
electrically connecting the ungrounded conductor of the RF transmission line between the ungrounded output of an RF power supply and the input of the RF impedance matching network; and
electrically connecting the grounded conductor of the RF transmission line between the grounded output of the RF power supply and said second connection area on the chamber cover.

6. The method of claim 2, further comprising the steps of:
providing said showerhead with a central portion and a perimeter portion, wherein the central portion includes said plurality of gas passageways;
providing an RF-powered back wall that is electrically conductive, that is located between the chamber cover and the showerhead, and that includes a central portion and a perimeter portion;
providing at least one RF-powered side wall that is electrically conductive;
electrically connecting the at least one RF-powered side wall between the perimeter portion of the RF-powered back wall and the perimeter portion of the showerhead; and
electrically connecting the output of the RF impedance matching network to at least a first RF drive point on the RF-powered back wall such that said electrical connection between the output of the RF impedance matching network and the showerhead includes the RF-powered back wall and the at least one RF-powered side wall.

7. The method of claim 2, wherein the step of providing an RF impedance matching network further comprises the steps of:
electrically connecting a first reactance between the input and the output of the RF impedance matching network; and
electrically connecting a second reactance between the first reactance and said first connection area on the chamber cover.

\* \* \* \* \*